(12) United States Patent
Palmer et al.

(10) Patent No.: US 8,070,569 B2
(45) Date of Patent: Dec. 6, 2011

(54) COOLING APPARATUS AND METHOD

(75) Inventors: Jeffrey Scott Palmer, Ligonier, PA (US); Stanley J. Piwowar, Avonmore, PA (US)

(73) Assignee: Ice Qube, Inc., Greensburg, PA (US)

( * ) Notice: Subject to any disclaimer, the term of this patent is extended or adjusted under 35 U.S.C. 154(b) by 323 days.

(21) Appl. No.: 12/263,470

(22) Filed: Nov. 1, 2008

(65) Prior Publication Data

US 2009/0117843 A1 May 7, 2009

Related U.S. Application Data

(60) Provisional application No. 61/001,701, filed on Nov. 2, 2007, provisional application No. 61/050,961, filed on May 6, 2008.

(51) Int. Cl.
*F24F 11/00* (2006.01)

(52) U.S. Cl. .......................... 454/184; 700/299; 700/300

(58) Field of Classification Search .................. 454/184; 700/299, 300
See application file for complete search history.

(56) References Cited

U.S. PATENT DOCUMENTS

| | | |
|---|---|---|
| 4,136,822 A | 1/1979 | Felter |
| 4,211,207 A | 7/1980 | Molvadas |
| 4,250,716 A | 2/1981 | Huffman |
| 5,123,875 A | 6/1992 | Eubank et al. |
| 5,207,613 A | 5/1993 | Ferchau et al. |
| 5,354,233 A | 10/1994 | Mandy et al. |
| 5,438,226 A | 8/1995 | Kuchta |
| 5,467,607 A | 11/1995 | Harvey |
| 5,593,347 A | 1/1997 | Mandy et al. |
| 5,646,825 A | 7/1997 | Huttenlocher |
| 5,755,282 A | 5/1998 | Teshima |
| 5,806,948 A | 9/1998 | Rowan, Sr. |
| 5,924,924 A | 7/1999 | Richardson |
| 5,936,820 A | 8/1999 | Umemura |
| 6,058,011 A | 5/2000 | Hardt et al. |
| 6,102,793 A | 8/2000 | Hansen |
| 6,104,003 A | 8/2000 | Jones |
| 6,123,266 A | 9/2000 | Bainbridge |
| 6,164,369 A | 12/2000 | Stoller |

(Continued)

FOREIGN PATENT DOCUMENTS

JP 2000349478 12/2000

(Continued)

OTHER PUBLICATIONS

A.G. Williamson et al., Cooling of telecommunications enclosures in tropical & desert environments, Intelec 2001, Edinburgh, Oct. 14-18, 2001, Conference Publication No. 484 (IEEE 2001).

(Continued)

*Primary Examiner* — Steven B McAllister
*Assistant Examiner* — Samantha Miller
(74) *Attorney, Agent, or Firm* — Stephen Ross Green; Lee Kim

(57) ABSTRACT

A cooling apparatus and method for temperature sensitive components or equipment housed in an enclosure are provided. The cooling apparatus and method removes hot air from the enclosure upon power or air conditioner failure or rise in temperature. The cooling apparatus and method helps to regulate the temperature of air in the enclosure. The cooling apparatus and method may be combined with existing enclosures either as a primary or auxiliary or "back-up" cooling system.

22 Claims, 5 Drawing Sheets

U.S. PATENT DOCUMENTS

| | | |
|---|---|---|
| 6,280,318 B1 | 8/2001 | Criss-Puszkiewicz et al. |
| 6,317,320 B1 | 11/2001 | Cosley et al. |
| 6,351,381 B1 | 2/2002 | Bilski et al. |
| 6,407,533 B1 | 6/2002 | Bartek et al. |
| 6,462,949 B1 | 10/2002 | Parish, IV |
| 6,483,107 B1 | 11/2002 | Rabinovitz et al. |
| 6,579,168 B1 | 6/2003 | Webster et al. |
| 6,582,296 B2 | 6/2003 | Komiyama |
| 6,704,198 B2 | 3/2004 | Replogle et al. |
| 6,798,657 B1 | 9/2004 | Clifton |
| 6,822,861 B2 | 11/2004 | Meir |
| 6,882,531 B2 | 4/2005 | Modica |
| 6,981,915 B2 * | 1/2006 | Moore et al. ............ 454/184 |
| 6,997,006 B2 | 2/2006 | Kameyama |
| 7,042,722 B2 | 5/2006 | Suzuki |
| 7,209,350 B2 | 4/2007 | Merlet et al. |
| 2003/0213853 A1 * | 11/2003 | Demster .................. 236/49.3 |
| 2005/0034468 A1 | 2/2005 | Dietz et al. |
| 2006/0172685 A1 | 8/2006 | O'Brien |
| 2007/0047199 A1 | 3/2007 | Tsutsui |

FOREIGN PATENT DOCUMENTS

| | | |
|---|---|---|
| JP | 2006351311 | 12/2006 |
| KR | 10-2000-0021495 A | 4/2000 |
| WO | 2006012073 | 2/2006 |

OTHER PUBLICATIONS

H.W. Markstein, Ed., Cooling electronic equipment enclosures, Electronic Packaging & Production, vol. 36, No. 5, 57-58, 60, 62, and 64, United States (Cahners Publishing May 1996).

Mike Turner et al., Fan Considerations in Enclosure Cooling, Electronic Packaging & Production, vol. 35, No. 6, 44-47, United States (Cahners Publishing Jun. 1995).

A.S. Kislovski, Fan-cooled power systems for telecom applications, Intelec 1993, Paris, Sep. 27-30, 1993, Conference Publication vol. 2, 293-299 (IEEE 1993).

Patrick A. Gillian, Fresh Air—Natural Asset, Intelec 2002, Canada, Conference Publication 470-477 (IEEE 2002).

* cited by examiner

US 8,070,569 B2

COOLING APPARATUS AND METHOD

CROSS-REFERENCE TO RELATED APPLICATIONS

This application claims the benefit of an earlier-filed U.S. Provisional Application, entitled "Cooling Apparatus and Method" having Ser. No. 61/001,701, filed Nov. 2, 2007, an earlier-filed U.S. Provisional Application, entitled "Cooling Apparatus and Method" having Ser. No. 61/050,961, filed May 6, 2008, and a co-pending International Application, entitled "Cooling Apparatus and Method" having Serial No. PCT/US08/082,170.

DETAILED DESCRIPTION

Figure 1C:
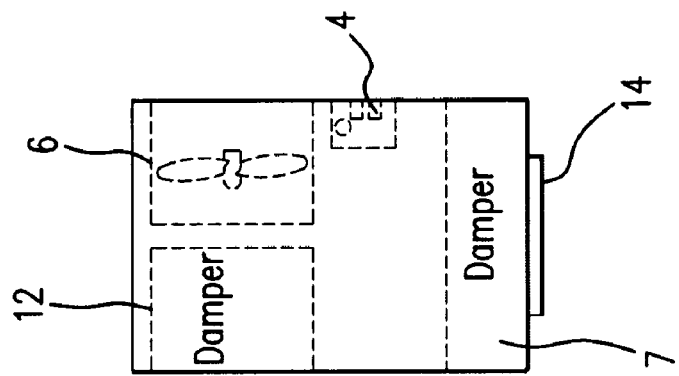
FIG. 1C is another side view of an exemplary embodiment of the cooling system from a side opposite to FIG. 1A.
Figure 1B:
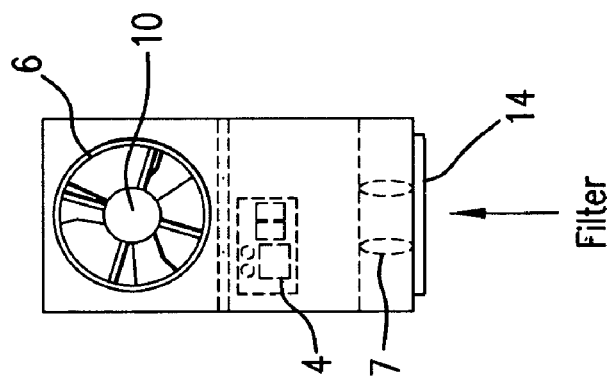
FIG. 1B illustrates a view of an exemplary embodiment of the cooling system from the perspective of the side of the apparatus which is secured to the enclosure for temperature sensitive equipment or components.
Figure 1A:
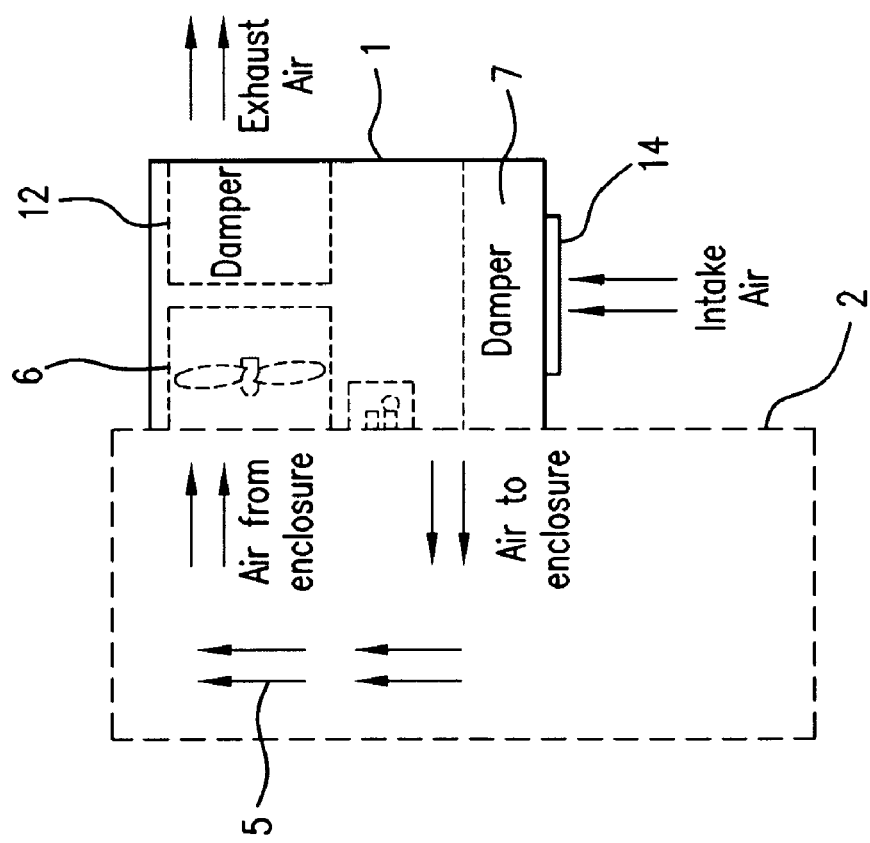
FIG. 1A illustrates a side view of an exemplary embodiment of the cooling system as further shown in an electronic circuit as depicted in FIG. 2A, 2B, or 3.

In one embodiment, FIGS. 1A, 1B, and 1C shows a cabinet (1) which includes a cooling apparatus ("device") which may be used as an auxiliary or "back-up" cooling system to supplement an existing air conditioning unit in enclosure (2), or as a primary cooling system for temperature sensitive equipment or components contained in an existing enclosure (2). The cabinet is in air flow communication with said enclosure such that air may be directed into said enclosure from said cabinet and exhausted from said enclosure through said cabinet. The mechanical and electrical components of this device are contained in a cabinet (1). Cabinet (1) also has a control circuit (4) to be described in detail below which controls the operation of the mechanical parts of this device as discussed in further detail below. The control circuit (4) and its associated mechanical parts help cool the enclosure (2) which houses temperature sensitive components or equipment In one embodiment, the apparatus and method described herein may be adopted and configured to be added onto existing temperature sensitive components or equipment enclosures that have been previously equipped with their own existing air conditioning unit.

Figure 2A:
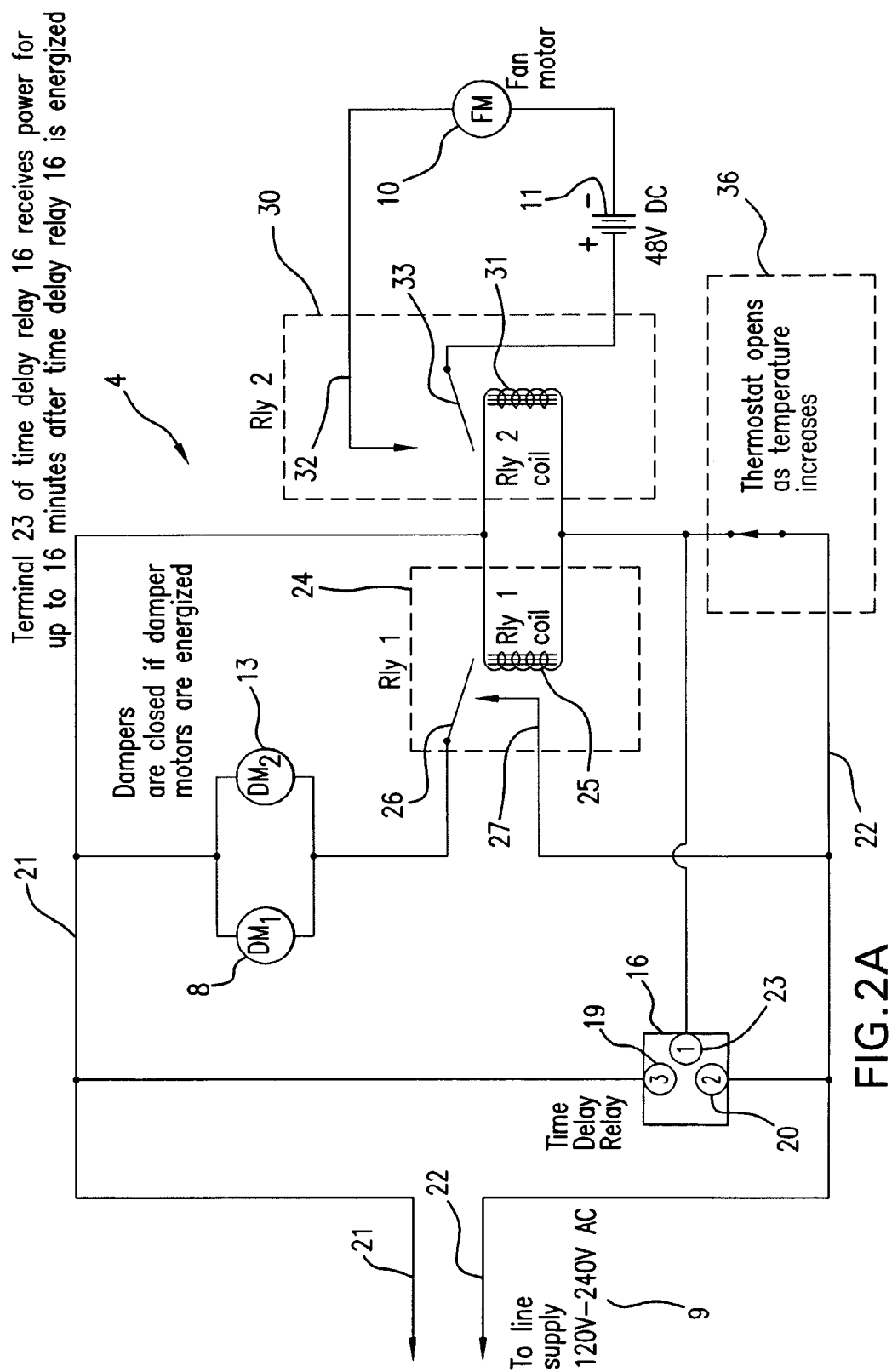
FIG. 2A illustrates an exemplary embodiment in schematic form of the electronic circuit which controls the components of the device.
Figure 2B:
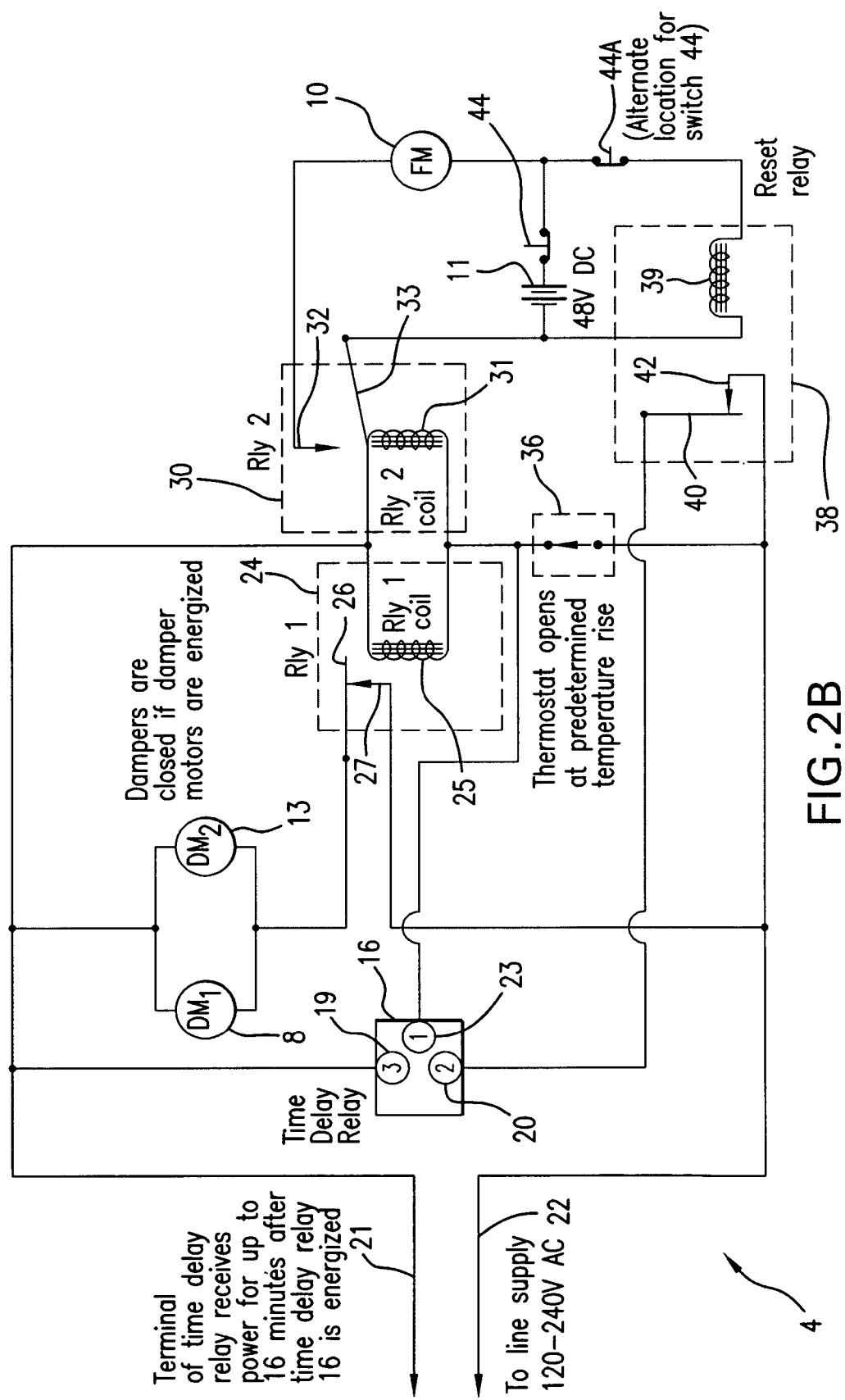
FIG. 2B illustrates the exemplary embodiment of FIG. 2A and also shows the electronic circuit of FIG. 2A as including a reset relay and a "push-to-break" switch.

For purposes of this detailed description, the term "power", "external power", "external power source," or "AC power" is used to refer to an external power source from a commercial or municipal supplier, or in the case of the terminology "DC power," "DC power supply," or "internal power source" from either a DC power source incorporated into control circuit (4) such as a battery and identified by reference numeral (11) in FIGS. 2A and 2B, or an existing source of DC power from the temperature sensitive equipment or components. The term "current", "AC current", or "DC current" is used in the explanation and description of the function and operation of the components in control circuit (4).

As shown in the embodiment of FIGS. 1A through 1C, and also referring to FIGS. 2A and 2B, cabinet (1) is connected to enclosure (2) such that air flows between cabinet (1) and enclosure (2) as controlled by the apparatus described herein. Cabinet (1) is provided with at least one exhaust fan (6), which is powered by fan motor (10). Within cabinet (1), at least one exhaust fan (6) is mounted so as to exhaust air from enclosure (2) through cabinet (1). Exhaust damper (12), through which at least one exhaust fan (6) transfers air exhausted from enclosure (2) into the atmosphere, is provided with exhaust damper motor (13) controls the opening and closing of exhaust damper (12). When exhaust damper motor (13) is not receiving power from an external power source, exhaust damper (12) is in an open position to allow the transfer of air from enclosure (2) and cabinet (1). When exhaust damper (12) is in an open position, air from cabinet (1) and enclosure (2) is expelled into the atmosphere provided that at least one exhaust fan (6) is in operation.

As also shown in the embodiment of FIGS. 1A through 1C, and also referring to FIGS. 2A and 2B, intake damper (7) is located within cabinet (1) so as to permit air from the atmosphere to enter cabinet (1) through particulate filter (14) and then into enclosure (2). Intake damper (7) is provided with an intake damper motor (8) which controls the opening and closing of intake damper (7). When intake damper (7) is in an open position, air is able to pass through particulate filter (14) into cabinet (1) and then into enclosure (2) to cool the temperature sensitive equipment or components. Like exhaust damper (12), intake damper (7) remains in an open position when intake damper motor (8) is not receiving power from the external power source.

As further shown in the embodiment of FIGS. 1A through 1C, and also referring to FIGS. 2A and 2B, the operation of intake damper (7), intake damper motor (8), exhaust damper (12), exhaust damper motor (13), and fan motor (10) are controlled by a control circuit (4) hereinafter described which responds to external power failures and temperature increases in enclosure (2).

In another embodiment of FIGS. 1A through 1C, and also referring to FIGS. 2A and 2B, when there is a power failure or an air conditioner failure occurs such that the temperature of the air in enclosure (2) increases above a predetermined temperature, control circuit (4) senses the power failure and/or the resultant increase in the temperature of the air in enclosure (2), thereby causing intake damper (7) and exhaust damper (12) to open and also causing at least one exhaust fan (6) to start. The exhaust fan (6) operates to direct the ambient air drawn from atmosphere through the bottom portion of the cabinet (1) for cooling the enclosure (2) (specifically, the air residing in the enclosure (2)) which houses temperature sensitive components or equipment. In an alternate embodiment, there is a plurality of exhaust fans (6).

In an embodiment of FIGS. 1A through 1C, and also referring to FIGS. 2A and 2B, the exhaust fan(s) (6) is/are battery-operated and operate on direct current at a voltage ranging from about 1 VDC to about 60 VDC. Since the exhaust fan(s) (6) is/are battery-operated, it/they may operate in the event of power failure or in the event of air conditioner failure, depending upon the size of application.

In an alternate embodiment of FIGS. 1A through 1C, and also referring to FIGS. 2A and 2B, the exhaust fan(s) (6) is/are electrically-operated at 120VAC or 240VAC, which may be from the external power source. In this alternate embodiment, the exhaust fan(s) (6) operate in the event of an air conditioner failure and a resultant temperature rise, but may not operate if the external power source fails.

In yet another embodiment of FIGS. 1A through 1C, and also referring to FIGS. 2A and 2B, a particulate filter (14) is mounted on the bottom side of the cabinet (1), in proximity to intake damper (7) such that intake damper (7) draws ambient air through particulate filter (14) into cabinet (1) when intake damper (7) is in an open position. Particulate filter (14) helps eliminate dust, residue, and the like from entering the cabinet (1) (i.e., when the intake damper (7) and exhaust damper (12) are open), to protect the electronics contained within the cooling apparatus, and also to help protect the enclosure which houses temperature sensitive components or equipment.

In another embodiment of FIGS. 1A through 1C, and also referring to FIGS. 2A and 2B, when the intake damper (7) and exhaust damper (12) are open, the exhaust fan(s) (6) induce/induces cooler ambient atmospheric air through particulate filter (14), through intake damper (7), and into cabinet (1) and enclosure (2), thereby creating a circulation of cooler air in the enclosure (2) and forcing the hot air from enclosure (2) out through cabinet (1) and exhaust damper (12) into the atmosphere.

In yet another embodiment, as shown in the embodiment of FIGS. 1A through 1C with reference to an embodiment shown in FIG. 2A, if there is no power failure and if the air conditioner is operational as determined by the thermostat (36), wherein the detected temperature of the air in enclosure (2) is at or below a certain predetermined temperature, the intake damper (7) and exhaust damper (12) are in their closed positions and the exhaust fan(s) (6) is/are not started.

In another embodiment of FIGS. 1A through 1C, and also referring to FIGS. 2A and 2B, when there is no power failure but if the air conditioner is not operational or otherwise insufficient as determined by thermostat (36), wherein the detected temperature exceeds a certain predetermined temperature, the intake damper (7) and exhaust damper (12) are opened by the control circuit (4) and the exhaust fan(s) (6) run/runs such that the cooler ambient atmospheric air is drawn into cabinet (1) through particulate filter (14) and intake damper (7) and then transferred into enclosure (2) to lower the temperature of the air contained therein on account of hot air being exhausted from enclosure (2) and through cabinet (1) by way of exhaust damper (12) into the atmosphere with the aid of at least one exhaust fan (6).

In yet another embodiment of FIGS. 1A through 1C, and also referring to FIGS. 2A and 2B, when there is power failure and the air conditioner is not operational or otherwise insufficient as determined by the thermostat (36), wherein the detected temperature exceeds a certain predetermined temperature, the intake damper (7) and exhaust damper (12) are both opened by the control circuit (4), and the exhaust fan(s) (6) start(s) such that the cooler ambient air is transferred into the enclosure (2) through particulate filter (14) and cabinet (1) on account of hot air being exhausted from enclosure (2) through cabinet (1) by way of exhaust damper (12) into the atmosphere with the aid of at least one exhaust fan (6).

In a further embodiment of FIGS. 1A through 1C, and also referring to FIGS. 2A and 2B, when the power is restored after a power failure, intake damper motor (8) closes intake damper (7) and exhaust damper motor (13) closes exhaust damper (12) on account of receiving power from the external power source which, in turn, de-energizes exhaust fan(s) (6). As discussed in further detail below, control circuit (4) "waits" for a predetermined amount of time to sense if the temperature of the air in cabinet (1) and enclosure (2) has fallen to an acceptable level. If the temperature of the air in cabinet (1) and enclosure (2) has not fallen to a predetermined temperature, control circuit (4) reopens intake damper (7) and exhaust damper (12) and re-start exhaust fan(s) (6) to assist the existing air conditioning unit already provided to enclosure (2).

In another embodiment of FIGS. 1A through 1C, and also referring to FIGS. 2A and 2B, the exhaust fan(s) (6) is/are electrically-operated with an alternating current ("AC") voltage ranging from about 120V AC to about 240V AC from an external power source. In this alternate embodiment, the exhaust fan(s) (6) operate in the event of air conditioner failure.

For a more detailed description of the device, reference is directed to the embodiment as depicted in FIGS. 1A through 1C and FIG. 2A. More specifically, FIG. 2A depicts in schematic form a control circuit (4) which controls intake damper motor (8), exhaust damper motor (13), and fan motor (10). In one embodiment, AC current from an external power source is supplied to control circuit (4) through power line (21) and power line (22), which are connected to an alternating current ("AC") supply which has a voltage within the range from about 120V AC to about 240V AC. In an embodiment, a time delay relay (16) is connected to power line (21) and power line (22) by way of a third terminal (19) of time delay relay (16) and a second terminal (20) of time delay relay (16). AC current from power line (21) and power line (22) is applied to the third terminal (19) of time delay relay (16) and second terminal (20) of time delay relay (16) whenever electrical power is supplied to power line (21) and power line (22). First terminal (23) of time delay relay (16) is electrically connected to first relay coil (25) of first relay (24) and second relay coil (31) of second relay (30), (as shown in the embodiment of FIG. 2A, first relay coil (25) and second relay coil (31) are connected in parallel with one another), so that each coil is energized by way of first terminal (23) of time delay relay (16) when AC current is applied to third terminal (19) of time delay relay (16) and second terminal (20) of time delay relay (16). Time delay relay (16) further includes a time delay feature such that after AC current has been supplied to second terminal (20) of time delay relay (16) and third terminal (19) of time delay relay (16), AC current is supplied through first terminal (23) of time delay relay (16) for up to a maximum predetermined time. After the maximum predetermined time has lapsed, AC current ceases at first terminal (23) of time delay relay (16). In an embodiment, the maximum predetermined time is 16.66 minutes and the designated amount of time may be adjusted by the user from about 10 seconds to about 1,000 seconds (i.e., 16.66 minutes).

In an embodiment with general reference to the embodiment shown in FIGS. 2A and 2B, AC current flows from first terminal (23) to first relay coil (25) of first relay (24) and second relay coil (31) of second relay (30) to energize first relay coil (25) and second relay coil (31), respectively, for up to a maximum predetermined time. When first relay coil (25) of first relay (24) and second relay coil (31) of second relay (30) are energized, first armature (26) and first contact (27) of first relay (24) close a first circuit (not specifically shown in the embodiments of FIGS. 2A and 2B) which includes intake damper motor (8) and exhaust damper motor (13) (which are wired in parallel as may be seen in FIG. 2A). Similarly, when second relay coil (31) of second relay (30) is energized, a second circuit (likewise not specifically shown in the embodiments of FIGS. 2A and 2B) which includes second armature (33) of second relay (30), second contact (32) of second relay (30), fan motor (10), and an internal power source in the form of a DC power source (11) (which supplies DC current to the fan motor (10)) is opened. DC power source (11) may be a separate battery contained internally within enclosure (2) or cabinet (1) or may be a DC current source derived from the temperature sensitive equipment's or components' own auxiliary power supply. In FIGS. 2A and 2B, DC power source (11) is shown to have a potential of 48 volts for purposes of illustration. However, those skilled in the art will note that a variety of voltages may be selected depending upon the voltage requirements of either fan motor (10) in FIG. 2A or fan motor (10) and reset relay coil (39) of reset relay (38) in FIG. 2B, to be discussed in greater detail below. In an alternate embodiment, the exhaust fan(s) (6) as shown in the embodiments of FIGS. 2A and 2B is/are electrically-operated from about 120V AC to about 240V AC from the external power source. In that alternate embodiment with reference to the embodiments of FIGS. 2A and 2B, the exhaust fan(s) (6) operate in the event of air conditioner failure, but not a power failure. In other embodiments exhaust fan(s) (6) as shown in the embodiments of FIGS. 2A and 2B may be powered from external DC power sources in enclosure (2) which supply the temperature sensitive equipment or components being cooled as previously mentioned.

In another embodiment with reference to FIGS. 2A and 2B, thermostat (36) is able to sense the temperature of the air in enclosure (2), and responds to a temperature increase over the predetermined temperature by opening any circuit in which it is connected. In this embodiment, it is connected to first relay coil (25) of first relay (24) and second relay coil (31) of second relay (30) so as to be able to supply AC current to first relay coil (25) of first relay (24) and second relay coil (31) of second relay (30) as a separate current path, independent of the path provided by the first circuit as described above through first terminal (23) of time delay relay (16). Thermostat (36) interrupts the flow of AC current to first relay coil (25) and second relay coil (31) when the predetermined temperature is exceeded as determined by thermostat (36). When the thermostat (36) is open (i.e., when the temperature is above the predetermined temperature), no AC current is able to flow through it to first relay coil (25) of first relay (24) and second relay coil (31) of second relay (30) through thermostat (36). If no AC current is being supplied at terminal (23) of time delay relay (16) at that time (because of the passage of up to the maximum predetermined time as described above), no current reaches second relay coil (31) of second relay (30). Second contact (32) and second armature (33) of second relay (30) then closes the second circuit containing fan motor (10) and DC power source (11) and the fan motor (10) is energized so that exhaust fan(s) (6) start(s). Likewise, no AC current is supplied to first relay coil (25) of first relay (24) so that first contact (27) and first armature (26) of first relay (24) open the first circuit which includes intake damper motor (8) and exhaust damper motor (13). As a result, intake damper motor (8) and exhaust damper motor (13) are not receiving power, and intake damper (7) and exhaust damper (12) open. It thus may be seen that the device described herein is able to respond to a failure of the existing cooling apparatus by opening intake damper (7) and exhaust damper (12) and starting exhaust fan(s) (6) to cool the temperature sensitive equipment or components in enclosure (2).

Situation 1: External AC Power Failure Occurs.

In another embodiment with reference to FIGS. 2A and 2B, in the event of an AC power failure, there is no external power at power line (21) and power line (22). No power is supplied to terminals (19) and (20), of time delay relay (16) and so, no current is supplied at first terminal (23). Although thermostat (36) may initially be closed (because the temperature has not yet have increased appreciably), no AC current flows to first relay coil (25) and second relay coil (31) because there is no external power being supplied to control circuit (4). No current is available for intake damper motor (8) and exhaust damper motor (13). The first circuit through first armature (26) and first contact (27) has opened, but this is irrelevant because of the absence of AC power from the external power source anywhere in control circuit (4). Intake damper (7) and exhaust damper (12) then both open due to this absence of AC power. At the same time, second contact (32) and second armature (33) of second relay (30) close, because the second relay coil (31) is not receiving AC current. The second circuit containing second contact (32), second armature (33), an internal power source in the form of a DC power source (11), and fan motor (10) is then completed, and exhaust fan(s) (6) start(s), moving cooler atmospheric air through cabinet (1) and enclosure (2).

Situation 2: External AC Power is Restored Following a Failure, and the Temperature of the Air Inside Enclosure (2) is at or Below the Predetermined Temperature of Thermostat (36).

In an embodiment as shown in the embodiments of FIGS. 2A and 2B, after AC power has been restored such that AC current is once again present at power line (21) and power line (22), time delay relay (16) once again supplies AC current to the first terminal (23) of time delay relay (16) for a designated amount of time as selected by the user (using a "push-to-break" switch (44) as depicted in an embodiment shown in FIG. 2B) up to a maximum predetermined time. AC current from power line (22) is able to flow through first terminal (23) to first relay coil (25) and second relay coil (31) of first relay (24) and second relay (30) respectively. If the temperature of the air in enclosure (2) is at or below the predetermined temperature of thermostat (36), thermostat (36) presents an independent path for AC current to flow through thermostat (36) to first relay coil (25) and second relay coil (31). First relay coil (25) and second relay coil (31) remain energized even after time delay relay (16) has ceased to supply AC current to the first terminal (23) of time delay relay (16) because of this independent current path through thermostat (36). Because first relay coil (25) of first relay (24) is energized, AC current is able to flow from power line (22) through said first circuit, including first armature (26) and first contact (27) to intake damper motor (8) and exhaust damper motor (13) so that intake damper (7) and exhaust damper (12) remain closed. Additionally, because second relay coil (31) is also energized, which causes second armature (33) and second contact (32) to open, said second circuit is likewise open, and direct current ("DC") current does not flow through fan motor (10) and an internal power source in the form of a DC power source (11) such that exhaust fan(s) (6) do/does not operate. In an alternate embodiment, the exhaust fan(s) (6) is/are electrically-operated from a voltage range from about 120V AC to about 240V AC. In this alternate embodiment, the exhaust fan(s) (6) operate in the event of air conditioner failure.

Situation 3A: External AC Power is Restored after a Failure, but the Temperature of the Air Inside Cabinet (2) Remains Above a Predetermined Temperature of Thermostat (36).

Situation 3B: The Temperature of the Air Inside Enclosure (2) Increases to or Over the Predetermined Temperature of Thermostat (36) at any Time for any Reason.

In yet another embodiment with reference to FIG. 2A, when external AC power is restored, AC current flows through power line (21) and power line (22) to time delay relay (16). This allows AC current to initially flow from first terminal (23) of time delay relay (16) to first relay coil (25) and second relay coil (31) of first relay (24) and second relay (30) respectively. As a result, AC current is able to flow through first contact (27) and first armature (26) of first relay (24) to intake damper motor (8) and exhaust damper motor (13) which causes both intake damper (7) and exhaust damper (12) to close as a result of the existing air conditioning unit having commenced operation. After the maximum predetermined time, time delay relay (16) ceases supplying AC current through the first terminal (23) of time delay relay (16) as described previously, opening said first circuit. If the temperature of the air in the enclosure (2) remains above the predetermined temperature of thermostat (36), or if at any time, for any reason, the temperature of the air inside cabinet (2) increases above the predetermined temperature of thermostat (36), thermostat (36) remains open (assuming no previous external power failure stemming from a failure of power at power line (21) and power line (22)) so that first relay coil (25) of first relay (24) and second relay coil (31) of second relay (30) are again both deenergized because no AC current is flowing to first relay coil (25) and second relay coil (31) through either first terminal (23) of time delay relay (16) or thermostat (36). As a result, intake damper motor (8) and exhaust damper motor (13) are deenergized and reopen both intake damper (7) and exhaust damper (12). Furthermore, because second relay coil (31) of second relay (30) are also deenergized, DC current once again flows from an internal power source in the form of a DC power source (11) through second armature (33) and second contact (32) of second relay (30) to fan motor (10), thereby energizing exhaust fan(s) (6). In this manner, intake damper (7) and exhaust damper (12) reopen and exhaust fan(s) (6) is/are re-started to assist in reducing the temperature of the air in enclosure (2). In an alternate embodiment, the exhaust fan(s) (6) is/are electrically-operated from a voltage range of about 120V AC to about 240V AC. In an embodiment, the exhaust fan(s) (6) may operate in the event of air conditioner failure. In another embodiment, the exhaust fan(s) (6) operate to help cool the air in enclosure (2) containing temperature sensitive components or equipment.

In an alternate embodiment as shown in the embodiment of FIG. 2B, a control circuit (4) similar to that shown in FIG. 2A is further provided with a reset relay (38) which has reset relay coil (39) which receives power from DC power source (11). As a result, reset relay coil (39) is normally energized. Reset relay (38) has reset relay contact (42) and reset relay armature (40) which are electrically connected in series with power line (22) and second terminal (20) of time delay relay (16). As a result, second terminal (20) of time delay relay (16) receives power when reset relay armature (40) and reset relay contact (42) are both closed—i.e. reset relay coil (39) of reset relay (38) is energized.

In yet another embodiment with reference to FIG. 2B, one may interrupt power to second terminal (20) of time delay relay (16) to either test the operation of control circuit (4) or to "reset", or "restart" the designated amount of time as determined by the maximum predetermined time during which time delay relay (16) supplies AC current at the first terminal (23) of time delay relay (16). In particular, a "push-to-break" switch (44) is connected in series with DC power source (11) such that when "push-to-break" switch (44) is pushed it interrupts the flow of DC current to fan motor (10) and reset relay coil (39) of reset relay (38) from DC power source (11). Because reset relay armature (40) and reset relay contact (42) open when reset relay coil (39) of reset relay (38) is deenergized, the flow of AC current to second terminal (20) of time delay relay (16) through reset relay armature (40), reset relay contact (42), and line (22) is interrupted as well. When the "push-to-break" switch (44) is released, the process is reversed. Reset relay coil (39) is again energized, closing reset relay armature (40) and reset relay contact (42). This in turn allows current to again flow to second terminal (20) of time delay relay (16). Time delay relay (16) then supplies AC current to the first terminal (23) of time delay relay (16) for the aforesaid designated amount of time as determined by a maximum predetermined period of time. In effect, "push-to-break" switch (44) causes time delay relay (16) to treat the momentary interruption of DC current to reset relay coil (39) as an intermittent power failure. Stated another way, pushing "push-to-break" switch (44) may increase the time during which AC current is supplied by way of first terminal (23) to first relay coil (25) and second relay coil (31).

In another embodiment with reference to FIG. 2B, after restoration of external AC power from an actual power failure, wherein power line (21) and power line (22) are supplied with power, if "push-to-break" switch (44) is pressed and then released by a user during a designated amount of time as determined by the user, in which time delay relay (16) is still supplying AC current to terminal (23), this has the effect of "restarting" the maximum predetermined time period for time delay relay (16). A new time period starts from the perspective of time delay relay (16) (since time delay relay (16) has been "reset") during which AC current is supplied to first terminal (23) of time delay relay (16) and thus to first relay coil (25), first relay (24), second relay coil (31), and second relay (30). Thus, if thermostat (36) is above the predetermined temperature, intake damper (7) and exhaust damper (12) remain closed for an additional period of time as a result of the provision of the AC current and exhaust fan(s) (6) do not operate during the time period.

In still another embodiment with reference to FIG. 2B, "push-to-break" switch (44) may be located at an alternate position designated by reference numeral (44A). When "push-to-break" switch (44A) is pushed, it does not interrupt the flow of DC current to fan motor (10), although it temporarily interrupts the flow of current to reset relay coil (39) of reset relay (38).

Figure 3:
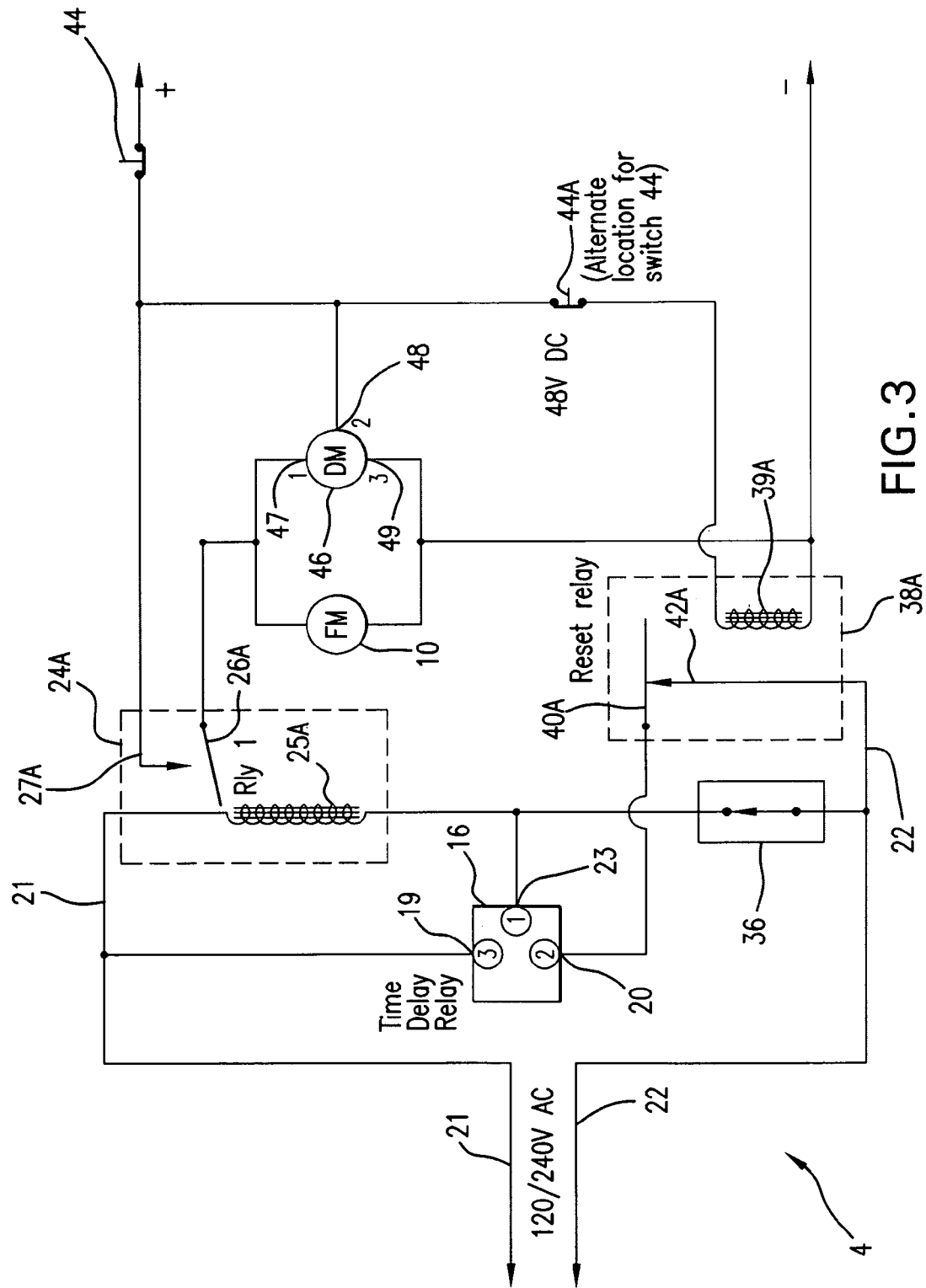
FIG. 3 illustrates an exemplary embodiment in schematic form of an alternative electronic circuit which controls the components of the device.

In an alternate embodiment, FIG. 3 shows a further alternative configuration for control circuit (4) in schematic form. The mechanical and electrical components of this device are contained in cabinet (1), similar to the embodiment shown in FIG. 2A. The control circuit (4) and its mechanical and electrical components, as previously described above in connection with FIG. 2A, help cool the enclosure (2) which houses temperature sensitive components or equipment. Additionally, "push-to-break" switch (44) as described previously may be located at an alternate position designated by reference numeral (44A). When "push-to-break" switch (44A) is pushed, it does not interrupt the flow of DC current to fan motor (10), although it temporarily interrupts the flow of current to reset relay coil (39) of reset relay (38). In one embodiment, the apparatus and method described herein may be adopted and configured as an add-on to existing temperature sensitive components or equipment enclosures.

Figure 4:
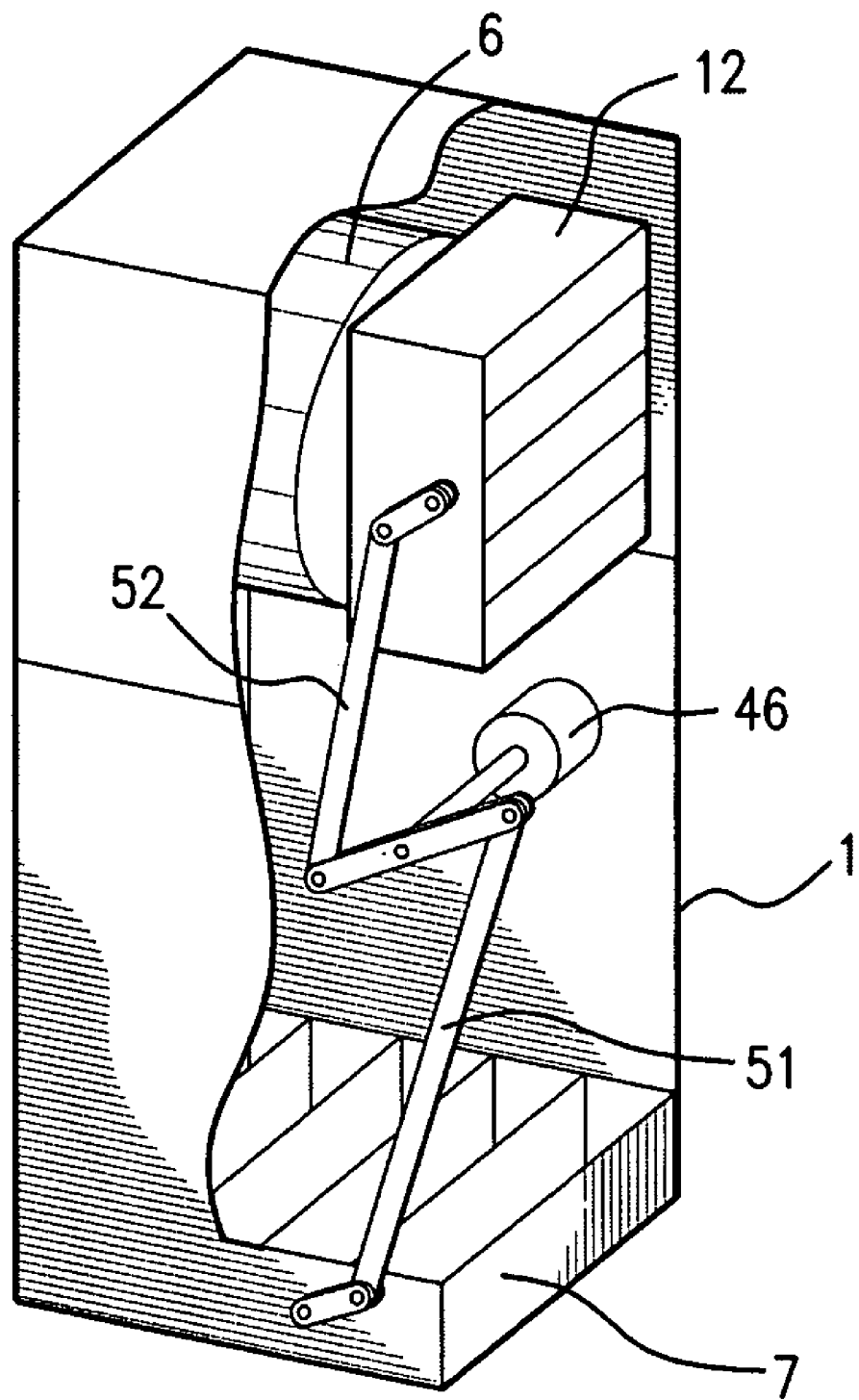
FIG. 4 illustrates an exemplary embodiment of the device in orthographic cut-away form showing a part of the interior of the device and a single damper motor operating an intake damper and an exhaust damper by way a first linkage and a second linkage.

As shown in the embodiments of FIGS. 1A through 1C and FIG. 3, cabinet (1) is connected to enclosure (2) such that air flows between cabinet (1) and enclosure (2) as controlled by the apparatus described herein. Cabinet (1) is provided with at least one exhaust fan (6), which is powered by fan motor (10). Within cabinet (1), at least one exhaust fan (6) is mounted so as to exhaust air from cabinet (1) and enclosure (2). In contrast with the embodiment as described with FIGS. 1 and 2, this embodiment of FIG. 3 provides a single damper motor (46) which actuates both intake damper (7) and exhaust damper (12) by way of first linkage (51) which is mechanically connected to intake damper (7) and second linkage (52) which is mechanically connected to exhaust damper (12) as shown in the embodiment of FIG. 4. First linkage (51) and second linkage (52) are shown in the embodiment of FIG. 4 in their respective relationships with damper motor (46) in the embodiment of FIG. 4, with reference to FIGS. 1 and 3. Damper motor (46) operates from an internal power source in the form of a direct current ("DC") supply which may be an auxiliary DC supply for the temperature sensitive equipment or components. Although FIG. 3 does not show a DC power source designated by reference numeral (11), those skilled in the art will note that control circuit (4) may be operated from a DC power source integral with control circuit (4) similar to the one identified by reference numeral (11) in FIGS. 2A and 2B, or, in the alternative, control circuit (4) may be operated from a DC current from an existing DC supply source for the temperature sensitive equipment or components. As mentioned with regard to FIGS. 2A and 2B, the voltage supplied by the DC supply in this embodiment may be selected depending upon the power requirements of fan motor (10), and also the power requirements of reset relay coil (39A), to be discussed below.

By way of configuration as depicted in the embodiment of FIG. 3, third terminal (49) of damper motor (46) is directly connected to the negative side of the DC supply, and second terminal (48) of damper motor (46) is connected directly to the positive side of the DC supply. Both first terminal (47) and third terminal (49) of damper motor (46) are connected in parallel with the fan motor (10). First terminal (47) of damper motor (46) is also connected to the positive side of the DC supply through first armature (26A) and first contact (27A) of first relay (24A). When DC current is applied to first terminal (47), the damper motor (46), which is bidirectional, reverses position from its present state. As noted above, the direct current supply may be the DC supply for the temperature sensitive equipment or components being cooled, or a separate source such as a battery, as described in the other embodiments herein.

As shown in an embodiment of FIG. 3, first relay coil (25A) of first relay (24A) is supplied with AC current by way of third terminal (19) of time delay relay (16) and first terminal (23) of time delay relay (16), in a manner similar to the embodiment described in FIG. 2A. After the designated amount of time as determined by the maximum predetermined period of time has expired, first relay coil (25A) of first relay (24A) does not receive AC current from first terminal (23) of time delay relay (16). However, if the temperature of the air in enclosure (2) is at or below the predetermined temperature of thermostat (36), first relay coil (25A) receives AC current through thermostat (36). As a result, first armature (26A) and first contact (27A) are opened and no DC current from the DC supply is able to flow to first terminal (47) of damper motor (46) and fan motor (10). Damper motor (46) closes intake damper (7) and exhaust damper (12) by way of first linkage (51) and second linkage (52) respectively as shown with reference to the embodiment of FIG. 4.

As further shown in an embodiment of FIGS. 3 and 4, in the event of a failure of the external AC power supply or in the event of a temperature increase of the air within enclosure (2) above the predetermined temperature of thermostat (36) first relay coil (25A) no longer receives AC power from power line (21) and power line (22), through either first terminal (23) and third terminal (19) of time delay relay (16) or thermostat (36). First armature (26A) and first contact (27A) then closes which then provides a path for DC current from the DC supply to fan motor (10) and damper motor (46). Exhaust fan (6) starts and damper motor (46) opens intake damper (7) and exhaust damper (12) by way of first linkage (51) and second linkage (52) respectively as described with reference to the embodiment of FIG. 4.

In an embodiment as shown in FIGS. 3 and 4, and similar to the embodiment shown in FIGS. 2A and 2B, upon the restoration of external AC power after a power loss, time delay relay (16) initially supplies AC current to first terminal (23) of time delay relay (16) and, thus, to first relay coil (25A) of first relay (24A) for a maximum predetermined time if utilizing the "push-to-break" switch (44). After maximum predetermine time has passed, AC current is no longer supplied to the first relay coil (25A) of first relay (24A) through first terminal (23), but AC current may still be supplied to first relay coil (25A) of first relay (24A) through thermostat (36), so long as the temperature of the air is at or below the predetermined temperature as monitored by thermostat (36) in which case first relay coil (25A) of first relay (24A) is energized, drawing first armature (26A) away from first contact (27A) such that DC power cannot flow to fan motor (10) and first terminal (47) of damper motor (46). Exhaust fan (6) stops running and damper motor (46) closes intake damper (7) and exhaust damper (12).

However, in a further embodiment as shown in FIGS. 3 and 4, in the event that the temperature of the air in enclosure (2) remains above the predetermined temperature of thermostat (36), the contacts of thermostat (36) open, thereby preventing the flow of AC current to first relay coil (25A) of first relay (24A) through thermostat (36). At such time as time delay relay (16) has ceased supplying AC current to the first terminal (23) of time delay relay (16), no AC current flows to first relay coil (25A) by way of first terminal (23) of time delay relay (16). This causes first contact (27A) and first armature (26A) of first relay (24A) to again close, allowing DC current from the DC supply to flow to fan motor (10) and to first terminal (47) of damper motor (46), thus causing exhaust fan (6) to start and damper motor (46) to reopen intake damper (7) and exhaust damper (12).

In yet another embodiment as shown in FIG. 3, a "push-to-break switch" (44) momentarily interrupts the supply of DC current from the DC supply to reset relay coil (39A) of reset relay (38A), when the "push-to-break switch" is pressed and released by a user, thereby causing reset relay contact (42B) and reset relay armature (40A) of reset relay (38A) to open, interrupting the flow of AC current to second terminal (20) of time delay relay (16). This, in turn, interrupts the flow of AC current to second terminal (20) of time delay relay (16). This has a similar effect as described in previous embodiments, namely to extend the designated amount of time as selected by the user for which AC current through the first terminal (23) of time delay relay (16) is provided to first relay coil (25A). If thermostat (36) is above the predetermined temperature, intake damper (7) and exhaust damper (12) remain in their respective closed positions, and fan (10) does not operate.

In still another embodiment with reference to FIG. 3, "push-to-break" switch (44) as previously described above may be located at an alternate position designated by reference numeral (44A). When "push-to-break" switch (44A) is pushed, it does not interrupt the flow of DC current to fan motor (10), although it temporarily interrupts the flow of current to reset relay coil (39) of reset relay (38).

What is claimed is:

1. A cooling apparatus for temperature sensitive components or equipment housed in an enclosure comprising:
   a) a cabinet being in air flow communication with said enclosure such that air may be directed into said enclosure from said cabinet and exhausted from said enclosure through said cabinet;
   b) intake means secured to said cabinet, said intake means having open and closed positions such that air from the atmosphere can enter said cabinet when said intake means is in said open position, said intake means being disposed in said open position in the absence of power from an external power source;
   c) exhaust means secured to said cabinet, said exhaust means having open and closed positions such that air can be exhausted into the atmosphere from said cabinet when said exhaust means is in said open position, said exhaust means being disposed in said open position in the absence of power from said external power source;
   d) a fan and a fan motor for operating said fan, secured in proximity to said exhaust means such that said fan exhausts air from said enclosure through said cabinet when said fan is in operation;
   e) an internal power source for said fan motor; and,
   f) a control circuit for controlling power from said external power source to said intake means and said exhaust means to allow said intake means and said exhaust means to open and to cause said fan motor to operate if either
   (1) said power from said external power source fails, or
   (2) the temperature of air in said enclosure rises above a predetermined temperature,
   and further, to cause said intake means and said exhaust means to close and to cause said fan motor to not operate if both
   (1) said power from said external power source has either not failed or has been restored after said failure, and
   (2) the temperature of the air in said enclosure is at or below said predetermined temperature,
   said control circuit further being able to subsequently allow said intake means and said exhaust means to reopen and to restart said fan motor after a maximum predetermined period of time has passed following restoration of said external power source after said failure if the temperature of the air in said enclosure remains above said predetermined temperature.

2. The cooling apparatus of claim 1 wherein said intake means comprises at least one intake damper operated by a corresponding intake damper motor, and said exhaust means comprises at least one exhaust damper operated by an exhaust damper motor, wherein said intake damper motor closes said intake damper and said exhaust damper motor closes said exhaust damper when power is supplied to said intake means and said exhaust means from said external power source through said control circuit.

3. The cooling apparatus of claim 2 wherein said control circuit comprises a first relay having a first relay coil, a second relay having a second relay coil, said first relay coil and said second relay coil being electrically connected so as to be able to receive power from said external power source through either a time delay relay or a thermostat connected to said external power source, said thermostat being configured so as to open when the temperature of the air in said enclosure exceeds said predetermined temperature and close when said temperature of the air is at or below said predetermined temperature, said time delay relay being able to apply power to said first relay coil and second relay coil from said external power source for a maximum predetermined time, said first relay having a first armature and a first contact which stops the flow of power to said intake damper motor and said exhaust damper motor if said first relay coil is not receiving power, said second relay having a second armature and a second contact which start the flow of power from said internal power source to said fan motor if said second relay coil is not receiving power from said external power source.

4. The cooling apparatus of claim 3 wherein said internal power source is a source of direct current.

5. The cooling apparatus of claim 4 wherein said internal power source is a battery.

6. The cooling apparatus of claim 3 wherein said control circuit further comprises a "push-to-break" switch and a reset relay for momentarily interrupting the flow of external power from said external power source, causing said time delay relay to restart the time period for said maximum predetermined time that it supplies power to said first relay coil and said second relay coil.

7. A cooling apparatus for temperature sensitive components or equipment housed in an enclosure comprising:
   a) a cabinet being in air flow communication with said enclosure such that air may be directed into said enclosure from said cabinet and exhausted from said enclosure through said cabinet;
   b) intake means secured to said cabinet, said intake means having open and closed positions such that air from the atmosphere can enter said cabinet when said intake means is in said open position;
   c) exhaust means secured to said cabinet, said exhaust means having open and closed positions such that air can be exhausted into the atmosphere from said cabinet when said exhaust means is in said open position;
   d) a fan and a fan motor for operating said fan, secured in proximity to said exhaust means such that said fan exhausts air from said enclosure through said cabinet when said fan is in operation;
   e) actuating means mechanically linked to said intake means and said exhaust means for opening and closing said intake means and said exhaust means,
   f) an internal power source for said fan motor and said actuating means; and,
   g) a control circuit for controlling said actuating means and said fan motor to cause said actuating means to open said intake means and said exhaust means and to cause said fan motor to operate if either
   (1) power from an external power source fails, or
   (2) the temperature of air in said enclosure rises above a predetermined temperature,
   and further, to cause said actuating means to close said intake means and said exhaust means and to cause said fan motor to not operate if both
   (1) said power from said external power source has either not failed or has been restored after said failure, and
   (2) the temperature of the air in said enclosure is at or below said predetermined temperature,
   said control circuit further being able to subsequently cause said actuating means to reopen said intake means and said exhaust means and restart said fan motor after a maximum predetermined period of time has passed following restoration of said external power source after said failure if the temperature of the air in said enclosure remains above said predetermined temperature.

8. The cooling apparatus of claim 7 wherein said internal power source is direct current.

9. The cooling apparatus of claim 8 wherein a damper motor and said fan motor receive direct current power through a first armature of a first relay and a first contact of said first relay, wherein said first relay has a first relay coil, said first relay coil receiving power from said external power source through either a time delay relay or a thermostat, said time delay relay supplying power from said external power source for a maximum predetermined period of time, said thermostat supplying power from said external power source to said first relay coil if said temperature of the air in said enclosure is at or below a predetermined temperature.

10. A cooling apparatus for temperature sensitive components or equipment housed in an enclosure comprising:
   a) a cabinet being in air flow communication with said enclosure such that air may be directed into said enclosure from said cabinet and exhausted from said enclosure through said cabinet;
   b) intake means secured to said cabinet, said intake means having open and closed positions such that air from the atmosphere can enter said cabinet when said intake means is in said open position, said intake means being disposed in said open position in the absence of power from an external power source;
   c) exhaust means secured to said cabinet, said exhaust means having open and closed positions such that air can be exhausted into the atmosphere from said cabinet when said exhaust means is in said open position, said exhaust means being disposed in said open position in the absence of power from said external power source;
   d) a fan and a fan motor for operating said fan, secured in proximity to said exhaust means, such that said fan exhausts air from said enclosure through said cabinet when said fan is in operation;
   e) an internal power source for said fan motor; and,
   f) a control circuit for controlling power from said external power source to said intake means and said exhaust means to allow said intake means and said exhaust means to open and to supply power from said internal power source to said fan motor to cause said fan motor to operate if either
   (1) power from said external power source fails, or
   (2) the temperature of air in said enclosure rises above a predetermined temperature,
   and further, to cause said intake means and said exhaust means to close and to interrupt power from said internal power source to said fan motor to cause said fan motor to not operate if both
   (1) said power from said external power source has either not failed or has been restored after said failure, and
   (2) the temperature of the air in said enclosure is at or below said predetermined temperature, said control circuit further being able to interrupt the flow of said external power to said intake means and said exhaust means allowing said intake means and said exhaust means to reopen and to supply power from said internal power source to said fan motor causing said fan motor to restart after a maximum predetermined period of time has passed following restoration of said external power source after said failure if the temperature of the air in said enclosure remains above said predetermined temperature, said control circuit further comprising a first relay having a first relay coil, a second relay having a second relay coil, said first and second relay coils being electrically connected so as to be able to receive power from said external power source through either a time delay relay or a thermostat connected to said external power source, said thermostat being configured so as to open when the temperature of the air in said enclosure exceeds said predetermined temperature and close when said temperature of the air is at or below said predetermined temperature, said time delay relay being able to apply power to said first relay coil and said second relay coil from said external power source for said maximum predetermined period of time, said first relay further having a first armature and a first contact which stop the flow of power to said intake means and said exhaust means if said first relay coil is not receiving power from said external power source, said second relay further having a second armature and a second contact which start the flow of power from said internal power source to said fan motor if said second relay coil is not receiving power from said external power source.

11. The cooling apparatus of claim 10 wherein said control circuit further comprises a "push-to-break" switch and a reset relay for momentarily interrupting the flow of external power from said source, causing said time delay relay to restart the time period for said maximum predetermined time that it supplies power to said first relay coil and said second relay coil.

12. A cooling method for cooling temperature sensitive components or equipment housed in an enclosure, comprising the steps of:
   a) providing a cabinet being in air flow communication with said enclosure such that air may be directed into said enclosure from said cabinet and exhausted from said enclosure through said cabinet;
   b) providing intake means secured to said cabinet, said intake means having open and closed positions such that air from the atmosphere can enter said cabinet when said intake means is in said open position, said intake means being disposed in said open position in the absence of power from an external power source;
   c) providing exhaust means secured to said cabinet, said exhaust means having open and closed positions such that air can be exhausted into the atmosphere from said cabinet when said exhaust means is in said open position, said exhaust means being disposed in said open position in the absence of power from said external power source;
   d) providing a fan and a fan motor for operating said fan, secured in proximity to said exhaust means such that said fan exhausts air from said enclosure through said cabinet when said fan is in operation;
   e) providing an internal power source for said fan motor; and,
   f) providing a control circuit for controlling power from said external power source to said intake means and said exhaust means to allow said intake means and said exhaust means to open and to cause said fan motor to operate if either
   (1) power from said external power source fails, or
   (2) the temperature of air in said enclosure rises above a predetermined temperature,
   and further, to cause said intake means and said exhaust means to close and to cause said fan motor to not operate if both
   (1) said power from said external power source has either not failed or has been restored after said failure, and
   (2) the temperature of the air in said enclosure is at or below said predetermined temperature,
   said control circuit further being able to subsequently allow said intake means and said exhaust means to reopen and to restart said fan motor after a maximum predetermined period of time has passed following restoration of said external power source after said failure if the temperature of the air in said enclosure remains above said predetermined temperature.

13. The cooling method of claim 12 wherein said intake means comprises at least one intake damper operated by a corresponding intake damper motor, and said exhaust means comprises at least one exhaust damper operated by an exhaust damper motor, wherein said intake damper motor closes said intake damper and said exhaust damper motor closes each said exhaust damper when power from said external power source is supplied to said intake means and said exhaust means through said control circuit.

14. The cooling method of claim 13 wherein said control circuit comprises a first relay having a first relay coil, a second relay having a second relay coil, said first relay coil and said second relay coil being electrically connected so as to be able to receive power from said external power source through either a time delay relay or a thermostat connected to said external power source, said thermostat being configured so as to open when the temperature of the air in said enclosure exceeds said predetermined temperature and close when said temperature of the air is at or below said predetermined temperature, said time delay relay being able to apply power to said first relay coil and second relay coil from said external power source for a maximum predetermined time, said first relay having a first armature and a first contact which stops the flow of power to said intake damper motor and said exhaust damper motor if said first relay coil is not receiving power, said second relay having a second armature and a second contact which start the flow of power from said internal power source to said fan motor if said second relay coil is not receiving power from said external power source.

15. The cooling method of claim 14 wherein said internal power source is a source of direct current.

16. The cooling method of claim 15 wherein said internal power source is a battery.

17. The cooling method of claim 14 wherein said control circuit further comprises a "push-to-break" switch and a reset relay for momentarily interrupting the flow of external power from said external power source, causing said time delay relay to restart the time period for said maximum predetermined time that it supplies power to said first relay coil and said second relay coil.

18. A cooling method for cooling temperature sensitive components or equipment housed in an enclosure, comprising the steps of:
   a) providing a cabinet being in air flow communication with said enclosure such that air may be directed into said enclosure from said cabinet and exhausted from said enclosure through said cabinet;
   b) providing intake means secured to said cabinet, said intake means having open and closed positions such that air from the atmosphere can enter said cabinet when said intake means is in said open position;
   c) providing exhaust means secured to said cabinet, said exhaust means having open and closed positions such that air can be exhausted into the atmosphere from said cabinet when said exhaust means is in said open position;
   d) providing a fan and a fan motor for operating said fan, secured in proximity to said exhaust means such that said fan exhausts air from said enclosure through said cabinet when said fan is in operation;
   e) providing actuating means mechanically linked to said intake means and said exhaust means for opening and closing said intake means and said exhaust means,
   f) providing an internal power source for said fan motor and said actuating means; and,
   g) providing a control circuit for controlling said actuating means and said fan motor to cause said actuating means to open said intake means and said exhaust means and to cause said fan motor to operate if either
      (1) power from an external power source fails, or
      (2) the temperature of air in said enclosure rises above a predetermined temperature and further, to cause said actuating means to close said intake means and said exhaust means and to cause said fan motor to not operate if both
      (1) said power from said external power source has either not failed or has been restored after said failure, and
      (2) the temperature of the air in said enclosure is at or below said predetermined temperature,
   said control circuit further being able to subsequently cause said actuating means to reopen said intake means and said exhaust means and restart said fan motor after a maximum predetermined period of time has passed following restoration of said external power source after said failure if the temperature of the air in said enclosure remains above said predetermined temperature.

19. The cooling method of claim 18 wherein said internal power source is direct current.

20. The cooling method of claim 19 wherein a damper motor and said fan motor receive direct current power through a first armature of a first relay and a first contact of said first relay, wherein said first relay has a first relay coil, said first relay coil being able to receive power from said external power source through either a time delay relay or a thermostat, said time delay relay supplying power from said external power source for a maximum predetermined period of time, said thermostat supplying power from said external power source to said first relay coil if said temperature of air in said enclosure is at or below a predetermined temperature.

21. A cooling method for cooling temperature sensitive components or equipment housed in an enclosure comprising the steps of:
   a) providing a cabinet being in air flow communication with said enclosure such that air may be directed into said enclosure from said cabinet and exhausted from said enclosure through said cabinet;
   b) providing intake means secured to said cabinet, said intake means having open and closed positions such that air from the atmosphere can enter said cabinet when said intake means is in said open position, said intake means being disposed in said open position in the absence of power from an external power source;
   c) providing exhaust means secured to said cabinet, said exhaust means having open and closed positions such that air can be exhausted into the atmosphere from said cabinet when said exhaust means is in said open position, said exhaust means being disposed in said open position in the absence of power from said external power source;
   d) providing a fan and a fan motor for operating said fan, secured in proximity to said exhaust means, such that said fan exhausts air from said enclosure through said cabinet when said fan is in operation;
   e) providing an internal power source for said fan motor; and,
   f) providing a control circuit for controlling power from said external power source to said intake means and said exhaust means to allow said intake means and said exhaust means to open and to supply power from said internal power source to said fan motor to cause said fan motor to operate if either (1) power from said external power source fails, or
(2) the temperature of air in said enclosure rises above a predetermined temperature, and further, to cause said intake means and said exhaust means to close and to interrupt power from said internal power source to said fan motor to cause said fan motor to not operate if both (1) said power from said external power source has either not failed or has been restored after said failure, and
(2) the temperature of the air in said enclosure is at or below said predetermined temperature, said control circuit further being able to interrupt the flow of said external power to said intake means and said exhaust means allowing said intake means and said exhaust means to reopen and to supply power from said internal power source to said fan motor causing said fan motor to restart after a maximum predetermined period of time has passed following restoration of said external power source after said failure if the temperature of the air in said enclosure remains above said predetermined temperature, said control circuit further comprising a first relay having a first relay coil, a second relay having a second relay coil, said first and second relay coils being electrically connected so as to be able to receive power from said external power source through either a time delay relay or a thermostat connected to said external power source, said thermostat being configured so as to open when the temperature of the air in said enclosure exceeds said predetermined temperature and close when said temperature of the air is at or below said predetermined temperature, said time delay relay being able to apply power to said first relay coil and said second relay coil from said external power source for said maximum predetermined period of time, said first relay further having a first armature and a first contact which stop the flow of power to said intake means and said exhaust means if said first relay coil is not receiving power from said external power source, and said second relay further having a second armature and a second contact which start the flow of power from said internal power source to said fan motor if said second relay coil is not receiving power from said external power source.

22. The cooling method of claim 21 wherein said control circuit further comprises the step of providing a "push-to-break" switch and a reset relay for momentarily interrupting the flow of external power from said source, causing said time delay relay to restart the time period for said maximum predetermined time that it supplies power to said first relay coil and said second relay coil.

* * * * *